United States Patent [19]

Shott, III et al.

[11] Patent Number: 4,897,650
[45] Date of Patent: Jan. 30, 1990

[54] SELF-CHARACTERIZING ANALOG-TO-DIGITAL CONVERTER

[75] Inventors: James T. Shott, III, Beaverton, Org.; Edward B. Stokes, Schenectady, N.Y.

[73] Assignee: General Electric Company, Schenectady, N.Y.

[21] Appl. No.: 178,045

[22] Filed: Apr. 5, 1988

[51] Int. Cl.$^4$ ............................................. H03M 1/10
[52] U.S. Cl. ................................... 341/120; 341/164; 341/165
[58] Field of Search ................. 341/94, 118, 120, 164, 341/165, 166

[56] References Cited

U.S. PATENT DOCUMENTS

| | | | |
|---|---|---|---|
| 4,335,373 | 6/1982 | Sloane | 341/120 |
| 4,340,856 | 7/1982 | Orlandi | 341/120 |
| 4,352,160 | 9/1982 | Frech et al. | 341/120 |
| 4,354,177 | 10/1982 | Sloane | 341/120 |
| 4,371,868 | 2/1983 | VandeGrift et al. | 341/120 |
| 4,580,126 | 4/1986 | Kato et al. | 341/120 |

OTHER PUBLICATIONS

S. T. Chu et al., "A 20 MHz Flash A/D Converter Macrocell", *Proc. of the IEEE Custom Integrated Circuits Conference*, May 20–23, 1985, pp. 160–162.

Primary Examiner—William M. Shoop, Jr.
Assistant Examiner—H. L. Williams
Attorney, Agent, or Firm—Marvin Snyder; James C. Davis, Jr.

[57] ABSTRACT

An analog-to-digital converter macrocell architecture is provided with digital logic for accumulating code-density data for dynamic characterization of the converter. Each macrocell includes an A/D converter (10), a comparator (12), a bin counter (14), a clock counter (16), and a histogram counter (18). the code output of the A/D converter (10) is compared in the comparator (12) with the output of the bin counter (14) and each match increments the histogram counter (18). The histogram counter (18) accumulates code-density data for A/D converter dynamic characterization, these data being read once for every cycle of the clock counter (16).

3 Claims, 1 Drawing Sheet

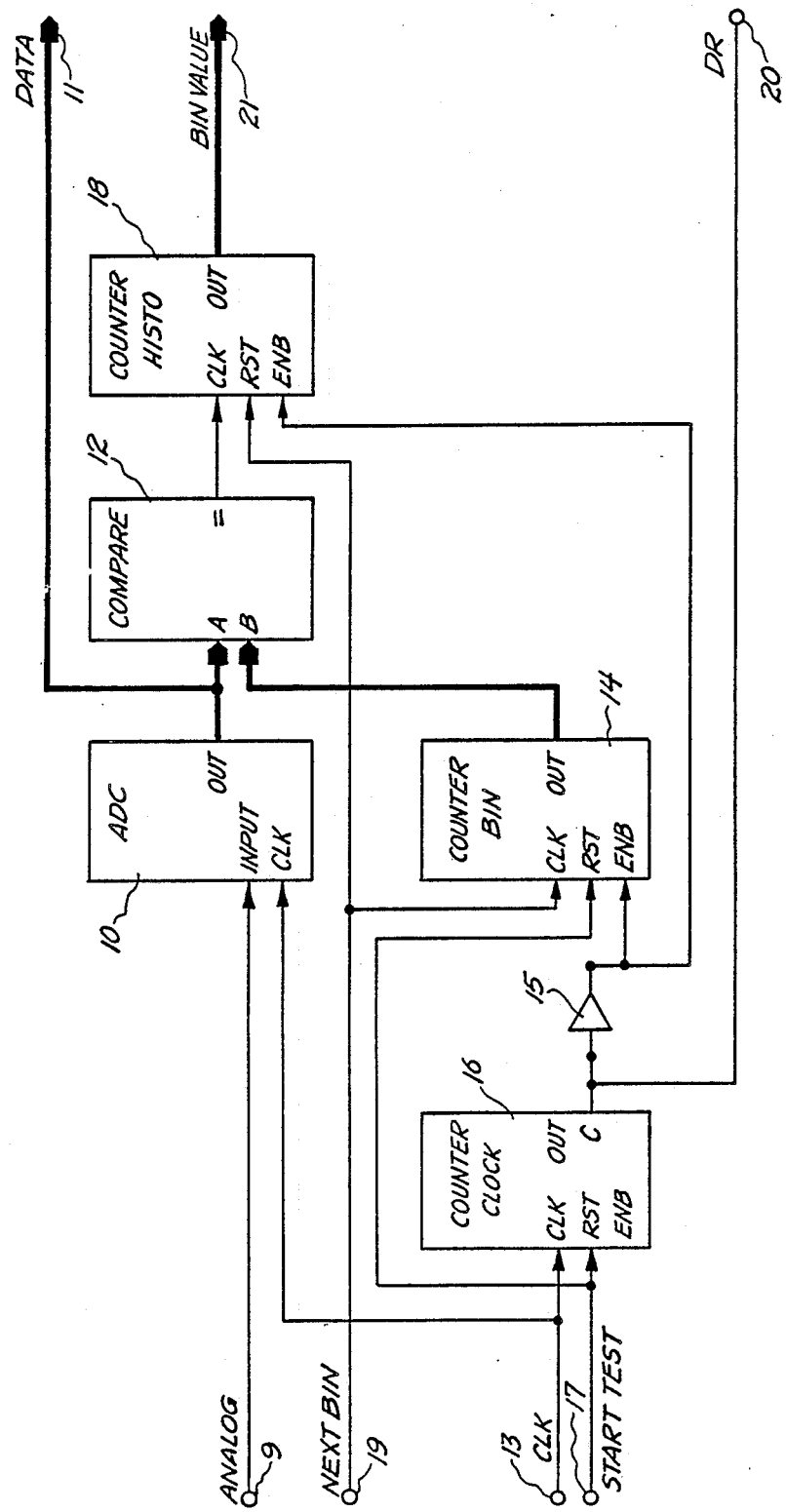

SELF-CHARACTERIZING ANALOG-TO-DIGITAL CONVERTER

BACKGROUND OF THE INVENTION

1. Field of the Invention

The present invention generally relates to analog-to-digital (A/D) converters and, more particularly, to a single chip A/D converter with built-in test circuitry that provides code-density histogram data to an external system.

2. Description of the Prior Art

A/D converters, including so-called flash A/D converters, are currently tested by first placing the A/D converter in a test bed wherein the electrical noise is negligible in comparison to the resolution of the A/D converter under test. The A/D converter analog input is simulated with a sinusoidal wave signal of sufficient spectral purity that the total distortion of the sinusoidal wave signal is negligible in comparison to the resolution of the A/D converter. The A/D converter digital output codes are then read into a random access memory (RAM) as fast as the A/D converter produces them. The resulting data is then analyzed by a digital computer to yield (1) missing output codes, (2) integral non-linearity, and (3) differential non-linearity.

There are two chief problems with this approach. As the A/D converter speeds become faster and A/D converter resolutions become finer, it becomes increasingly difficult to find RAM which will read A/D converter output codes at speed without adding an intolerable amount of electrical noise to the electrical noise floor of the test bed. In addition, the A/D converter characterization cannot easily be done later when the A/D converter has been incorporated into a larger system.

What is needed is a self-characterizing A/D converter which is testable without the usual requirement of an external system which is capable of acquiring data at the speed of operation of the A/D converter under test.

SUMMARY OF THE INVENTION

It is therefore an object of the present invention to provide a way to characterize an A/D converter which does not require the use of fast, noisy RAM in the test bed.

It is another object of the invention to provide a technique for the characterization of an A/D converter which can be easily implemented within the context of a larger system.

According to a preferred embodiment of the invention, there is included, within the architecture of A/D converter macrocells, digital logic circuitry comprising counters and comparators for the sole purpose of accumulating code-density data for A/D converter dynamic characterization. More specifically, each macrocell includes a counter clock, a bin counter, a comparator, and a histogram counter. The code output of the A/D converter macrocell is compared in the comparator with the output signal of the bin counter and each match increments the histogram counter.

The self-characterizing A/D converter according to the invention is inserted into a low noise test fixture, the clock is stimulated at speed using a pulse generator, and the analog input is provided with the signal from a high spectral purity sinusoid generator. A slow microcomputer interface, e.g., a General Purpose Input/Output (GPIO) device, may be used to generate various control signals and then, for a predetermined number of cycles, the digital output codes are compared with the output signal of the bin counter. For each match, the contents of the histogram counter are incremented. At the completion of the predetermined number of cycles, a microcomputer is used to read data from the histogram counter and increment the bin counter and reset the histogram counter, beginning the data acquisition for the next bin. The process is repeated for all bins to thereby generate a full dynamic characterization of the A/D converter without using any external fast RAM.

BRIEF DESCRIPTION OF THE DRAWING

The foregoing and other objects, aspects and advantages of the invention will be better understood from the following detailed description of a preferred embodiment of the invention with reference to the drawing, in which the sole FIGURE is a block diagram showing the architecture of the self-characterizing A/D converter according to the invention.

DETAILED DESCRIPTION OF A PREFERRED EMBODIMENT OF THE INVENTION

Referring now to the drawing, there is shown in block diagram form the architecture of a macrocell of a self-characterizing A/D converter according to the invention. The macrocell comprises an A/D converter 10, such as the 7-bit GE CRD Flash A/D converter macrocell/chip. A description of this macrocell/chip may be had with reference to the paper entitled "20 MHz Flash A/D Converter Macrocell" presented by S. T. Chu and J. L. Garrett at the 1985 Custom Integrated Circuit Conference. The paper appears at pages 160 to 162 of the proceedings of that conference. It will, however be understood that this particular A/D converter is but an example of the converter 10 and other A/D converters may be used in the practice of the invention.

The A/D converter 10 includes an analog input connected to analog signal input terminal 9, a digital code output, and a clock input for controlling the conversion process. The particular details of the A/D converter do not form a part of the present invention and, therefore, will not be described further except to say that other A/D converter macrocells/chips can be used in the practice of the invention.

The digital code output of the A/D converter 10 is connected to the data output terminal 11 and also to the first, or A, input of a digital comparator 12. As indicated by the heavy line, the digital code output of A/D converter 10 is a parallel output comprising, in the case of the GE CRD Flash A/D converter, seven signal lines. Accordingly, the data output terminal 11 and the first, or A, input of the digital comparator 12 are actually each plural inputs to accommodate the parallel data. The second, or B, input of the digital comparator 12 is supplied by the output of a bin counter 14. This output is also a parallel output having the same number of signal lines as the data output of the A/D converter 10.

The bin counter 14 has three inputs; a clock input for incrementing the counter, a reset input for initializing the counter at the beginning of a test, and an enable input. The enable input is supplied by the output of an inverter 15 which receives signals from a carry output of a clock counter 16. The carry output is also connected to output terminal 20 to provide an external microcomputer with an indication that a clock cycle has been completed. The clock counter count output is not used.

The clock counter 16 is similar to the bin counter 14 and includes three inputs, although only the clock and reset inputs are used. In this case, the clock input is connected, together with the clock input to the A/D converter 10, to an external clock (not shown) at input terminal 13, and the reset input is connected in common with the reset input of the bin counter to an external START TEST input at terminal 17 used to initialize the self-characterizing A/D converter for a test.

The output of the digital comparator 12, generated whenever there is a match between the code output of the A/D converter 10 and the count output of the bin counter 14, is used to increment a histogram counter 18. This counter is similar to the bin and clock counters and includes three inputs, the clock input being connected to the output of the digital comparator 12 as just described. The reset input is connected in common with the clock input of the bin counter 14 to an external next bin signal terminal 19. The enable input is connected to the output of the inverter 15. The parallel output of the histogram counter is connected to a bin value output terminal 21 to permit reading by an external microcomputer.

It will be understood that the A/D converter 10, the comparator 12 and the counters 14, 16 and 18, as well as the inverter 15, are typically incorporated into a single integrated circuit, or chip. Each of the terminals 9, 11, 13, 17, and 19 to 21 could be contact pads on a chip. According to this architecture, a plurality of such chips may be used to fabricate a complete A/D converter system of the desired resolution.

When the self-characterizing A/D converter is inserted into a low noise test fixture, the clocks are stimulated at speed using a pulse generator (not shown) connected to clock terminal 13. The analog input signal is provided at input terminal 9 from a high spectral purity sinusoid generator (not shown). A GPIO device (not shown) may be used to generate a rising edge on NEXT BIN terminal 19 and START TEST terminal 17, resetting the clock counter, bin counter and histogram counter to zero. For a predetermined number of cycles, for example the next $2^{20}$ cycles, as counted by the clock counter 16, the digital output codes from the A/D converter 10 are compared with the output of the bin counter 14, which is initially set to zero. Matches, as determined by the digital comparator 12, increment the histogram counter 18. After the $2^{20}$ cycle, the carry output of the clock counter 16 goes high, disabling the bin and histogram counters 14 and 18 and signalling the microcomputer (not shown) on terminal 20 that the data for the zero'th bin is ready for output. The microcomputer then is used to read the data from the zero'th bin at terminal 21 and generate a rising edge on NEXT BIN terminal 19, thus incrementing the bin counter 14 and beginning the data acquisition for the next bin. This process is repeated for all 128 bins. The result is a full dynamic characterization of the A/D converter without using an external fast RAM.

The invention provides a self-characterizing A/D converter which is testable without the external system needing to acquire data at the speed of operation of the A/D converter. Moreover, the A/D converter, having self-testing capability, can be easily tested in the context of a larger system.

While the invention has been described in terms of a single preferred embodiment, those skilled in the art will recognize that the invention can be practiced with modification within the spirit and scope of the appended claims.

What is claimed is:

1. An A/D converter architecture including an A/D converter and digital logic circuitry on a common chip, said A/D converter having an analog signal input for receiving a cyclically recurring test signal waveform and a digital code output, said digital logic circuitry comprising:

means for dividing the output signal of said A/D converter into a plurality of bins including bin counter means responsive to a next bin count input signal for providing a bin count output signal corresponding to a specific selectable digital value expected in said digital output code;

comparator means coupled to said A/D converter and responsive to said signal produced at the digital code output of said A/D converter and to said bin count output signal for generating an output signal for each match of said digital code output signal and said bin count output signal over a predetermined multiplicity of test signal waveform cycles; and histogram counter means reset by said next bin count input signal and incremented by said output signal of said comparator means for accumulating code-density data, whereby to generate a histogram of digital codes correlated with said bins, said histogram being readable at a lower rate than a conversion rate of said A/D converter to provide dynamic characterization of said A/D converter.

2. The A/D converter architecture as recited in claim 1 further comprising clock counter means responsive to an external clock signal for counting a predetermined number of clock signals to define a bin count duration, said clock counter means disabling said bin counter means and said histogram counter means at the end of a bin count and providing a signal to read said code-density data.

3. The A/D converter architecture as recited in claim 2 wherein said A/D converter is coupled to receive said external clock signal.

* * * * *